(12) United States Patent
Forbes et al.

(10) Patent No.: US 9,356,112 B2
(45) Date of Patent: May 31, 2016

(54) CHARGE TRAPPING DIELECTRIC STRUCTURES

(71) Applicant: Micron Technology, Inc., Boise, ID (US)

(72) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/518,759

(22) Filed: Oct. 20, 2014

(65) Prior Publication Data

US 2015/0035043 A1 Feb. 5, 2015

Related U.S. Application Data

(62) Division of application No. 13/323,633, filed on Dec. 12, 2011, now Pat. No. 8,866,210, which is a division of application No. 11/589,556, filed on Oct. 30, 2006, now Pat. No. 8,076,200.

(51) Int. Cl.
*H01L 29/792* (2006.01)
*H01L 29/51* (2006.01)
*H01L 29/423* (2006.01)

(52) U.S. Cl.
CPC .......... *H01L 29/518* (2013.01); *H01L 29/4234* (2013.01); *H01L 29/513* (2013.01); *H01L 29/792* (2013.01)

(58) Field of Classification Search
CPC .................. H01L 21/28273; H01L 21/28202; H01L 29/42324; H01L 29/517; H01L 29/518; H01L 29/66825; H01L 29/7883; H01L 29/792; H01L 21/28282; H01L 27/1052
See application file for complete search history.

(56) References Cited

U.S. PATENT DOCUMENTS

| | | | |
|---|---|---|---|
| 4,057,821 | A | 11/1977 | Patel |
| 5,808,353 | A | 9/1998 | Fuller et al. |
| 6,362,045 | B1 | 3/2002 | Lin et al. |
| 6,445,030 | B1 | 9/2002 | Wu et al. |
| 6,642,107 | B2 | 11/2003 | Seo et al. |
| 7,045,430 | B2 | 5/2006 | Ahn et al. |
| 7,352,631 | B2 | 4/2008 | Burnett et al. |

(Continued)

FOREIGN PATENT DOCUMENTS

| | | |
|---|---|---|
| JP | 05-129630 | 5/1993 |
| WO | WO-2008054689 A1 | 5/2008 |

OTHER PUBLICATIONS

"Atomic Layer Deposited Titanium Aluminum Oxide Films", U.S. Appl. No. 10/931,533, filed Aug. 31, 2004.

(Continued)

*Primary Examiner* — Khiem D Nguyen
(74) *Attorney, Agent, or Firm* — Schwegman Lundberg & Woessner, P.A.

(57) ABSTRACT

A dielectric structure may be arranged having a thin nitrided surface of an insulator with a charge blocking insulator over the nitrided surface. The insulator may be formed of a number of different insulating materials such as a metal oxide, a metal oxycarbide, a semiconductor oxide, or oxycarbide. In an embodiment, the dielectric structure may be formed by nitridation of a surface of an insulator using ammonia and deposition of a blocking insulator having a larger band gap than the insulator. The dielectric structure may form part of a memory device, as well as other devices and systems.

15 Claims, 5 Drawing Sheets

(56) References Cited

U.S. PATENT DOCUMENTS

| | | | |
|---|---|---|---|
| 8,076,200 | B2 | 12/2011 | Forbes et al. |
| 8,866,210 | B2 | 10/2014 | Forbes et al. |
| 2003/0207032 | A1 | 11/2003 | Ahn et al. |
| 2004/0043569 | A1 | 3/2004 | Ahn et al. |
| 2004/0144980 | A1 | 7/2004 | Ahn et al. |
| 2004/0175882 | A1 | 9/2004 | Ahn et al. |
| 2004/0214399 | A1 | 10/2004 | Ahn et al. |
| 2005/0037557 | A1 | 2/2005 | Doczy et al. |
| 2005/0054165 | A1 | 3/2005 | Ahn et al. |
| 2005/0153514 | A1* | 7/2005 | Lee .............. H01L 21/3144 438/287 |
| 2005/0174847 | A1 | 8/2005 | Forbes |
| 2005/0212082 | A1 | 9/2005 | Takeda et al. |
| 2005/0259484 | A1* | 11/2005 | Newell .......... G06F 12/1433 365/195 |
| 2006/0046505 | A1 | 3/2006 | Ahn et al. |
| 2006/0186457 | A1* | 8/2006 | Burnett ......... H01L 21/26586 257/315 |
| 2006/0197141 | A1 | 9/2006 | Ufert et al. |
| 2006/0211205 | A1 | 9/2006 | Jeon et al. |
| 2007/0059945 | A1 | 3/2007 | Mohklesi |
| 2007/0176227 | A1 | 8/2007 | Liu et al. |
| 2008/0026526 | A1* | 1/2008 | Rao ............... H01L 21/28273 438/257 |
| 2008/0099829 | A1 | 5/2008 | Forbes et al. |
| 2012/0080740 | A1 | 4/2012 | Forbes et al. |

OTHER PUBLICATIONS

"Memory Device Having an Amorphous Silicon Carbide Gate Insulator (As Amended Herein)", U.S. Appl. No. 11/236,101, filed Sep. 27, 2005.

"Method for Operating a Memory Device Having an Amorphous Silicon Carbide Gate Insulator", U.S. Appl. No. 09/135,413, filed Aug. 14, 1998.

"Search Report", International Application No. PCT/US2007/022796, 3 pgs, (Oct. 29, 2007).

"Written Opinion", International Application No. PCT/US2007/022796, (Feb. 26, 2006).

Ahn, Kie Y, "Atomic Layer Deposited Hafnium Tantalum Oxide Dielectrics", U.S. Appl. No. 11/029,757, filed Jan. 5, 2005.

Ahn, Kie Y, "Atomic Layer Deposited Lanthanum Hafnium Oxide Dielectrics", U.S. Appl. No. 11/010,529, filed Dec. 13, 2014.

Ahn, Kie Y, et al., "Hafnium Lanthanide Oxynitride Films", U.S. Appl. No. 11/515,143, filed Aug. 31, 2006.

Ahn, Kie Y, et al., "Tantalum Lanthanide Oxynitride Films", U.S. Appl. No. 11/514,545, filed Aug. 31, 2006.

Forbes, et al., "Amorphous Germanium Carbide and Graded Composition Germanium-Silicon Carbide Insulators for Tunnel and Gate Insulators in Flash Memory Devices", U.S. Appl. No. 11/114,403, filed Apr. 26, 2005.

Forbes, "Hafnium Aluminium Oxynitride High-K Dielectric and Metal Gates", U.S. Appl. No. 11/514,558, filed Aug. 31, 2006.

Forbes, "Hafnium Tantalum Oxynitride High-K Dielectric and Metal Gates", U.S. Appl. No. 11/515,114, filed Aug. 31, 2005.

Forbes, et al., "Tantalum Aluminum Oxynitride High-K Dielectric and Metal Gates", U.S. Appl. No. 11/514,655, filed Aug. 31, 2006.

Forbes, Leonard, et al., "Silicon Lanthanide Oxynitride Films", U.S. Appl. No. 11/514,533, filed Aug. 31, 2006.

Forbes, Leonard, et al., "Tantalum Silicon Oxynitride High-K Dielectrics and Metal Gates", U.S. Appl. No. 11/514,601, filed Aug. 31, 2006.

Sunamura, Hiroshi NEC, "Ultra-uniform threshold voltage in SONOS-type non-volatile memory with novel charge trap layer formed by plasma nitridation", 2006 Non-Volatile Semiconductor Memory Workshop, and workshop program, (2006), 4 pgs.

Yi, Sang-Be, "Characterizations of MONOS Structures with a Superthin Nitride Film for the Low Voltage NVSM using TSC Techniques", Proceedings fo the 5th International Conference on Properties and Applications of Dielecric Materials, (1997), 940-941.

* cited by examiner

CHARGE TRAPPING DIELECTRIC STRUCTURES

PRIORITY APPLICATION

This application is a divisional of U.S. application Ser. No. 13/323,633, filed Dec. 12, 2011, now issued as U.S. Pat. No. 8,866,210, which is a divisional of U.S. application Ser. No. 11/589,556, filed Oct. 30, 2006, now issued as U.S. Pat. No. 8,076,200, all of which are incorporated herein by reference in their entirety.

TECHNICAL FIELD

This disclosure relates generally to semiconductor devices and device fabrication, including device dielectric layers and methods of fabrication. More specifically, various embodiments relate t non-volatile memory devices.

BACKGROUND

Certain non-volatile memory devices may operate by trapping charges in a dielectric interface to adjust the threshold voltage of a transistor and thus program the desired digital value of the transistor. One method of trapping charges is found in nonvolatile read-only memory (NROM) devices that use a silicon nitride layer between a tunnel oxide layer and a blocking oxide layer to trap charges.

NROM devices may be used to replace floating gate nonvolatile memory, such as flash memory, since the equivalent oxide thickness (EOT) may be reduced, as compared to the two separate insulator layers sometimes used in flash devices (e.g., one below the floating gate electrode and one between the floating gate and the control gate electrode). A lower EOT may result in faster devices having increased reliability, due to less reliance on physically thin insulator layers.

For example, in a floating gate memory each one of the two surfaces of each insulator layer may be in contact with a conductive surface since each insulator layer may be located between conductive electrodes such as the substrate, the floating gate, and the control gate. Thus, a defect in either insulator layer may cause a device failure in a floating gate device. As a matter of contrast, defects may have less effect in an NROM device since the insulators can be in contact with each other, such as the nitride insulator between the tunnel and blocking insulators.

A potential issue with the use of a deposited nitride layer between the tunnel insulator and the blocking insulator is that the growth of a nitride layer on other insulator layers typically exhibits what is known as an incubation period, which may vary from place to place on the insulator. This may result in a non-uniform thickness nitride charge trapping layer, sometimes providing an increased EOT.

Another potential issue with the use of a nitride layer between two oxide layers (e.g., ONO) is that the physical thickness of the nitride layer can result in trapped charges that are at different distances from the semiconductor channel region and thus have slightly different effects on the channel. Threshold voltages may thus have a wider distribution from one device to another, or from one programming cycle to another, as the physical thickness of the nitride layer may be proportional to the threshold voltage variation range.

Yet another issue with nonvolatile memory devices using a nitride layer between a tunnel insulator and a blocking insulator is that the injected electrons may pass through the tunnel insulator as desired but not be trapped in the nitride layer and pass through the blocking insulator to be lost to the gate electrode. This charge loss situation may result in increased programming, or "write" times, and potentially increased write voltages. Thus, there is a need for improved structures and methods with respect to the manufacture of non-volatile or persistent memory devices, such as NROM devices.

DETAILED DESCRIPTION

Figure 1:
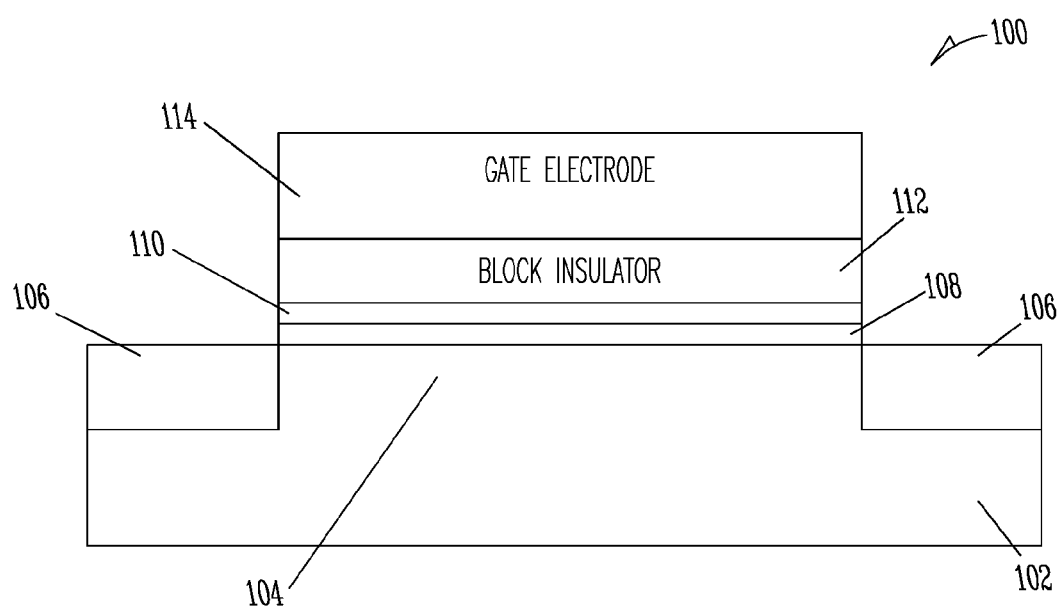
FIG. 1 illustrates an electronic device according to various embodiments of the invention.

When transistor dimensions are scaled downward, the properties of a nonvolatile memory transistor tend to follow those of a volatile transistor, including operating faster and at lower total power dissipation, with lower threshold voltages. By making a shorter channel length for the signal to traverse, the amount of time the signal carriers (either electrons or holes) spend in the channel decreases and the speed of the transistor increases. Reducing the lateral dimensions of a transistor also increases the electric field strength that the signal carriers encounter, which may result in faster carrier velocity and increased transistor speed; a lower operating voltage may sometimes also be used. Reducing the vertical dimensions of a transistor, such as the gate insulator (for example a silicon dioxide) thickness, also tends to increase the electric field strength at a selected gate voltage, which may the use of allow lower threshold voltages for the transistor, which may in turn increase the channel conductance, as well as increasing transistor reliability. However, reducing the gate insulator thickness may also result in defective devices and poor insulator properties, with increased leakage.

It is sometimes possible to reduce the effective gate insulator thickness without reducing the physical gate insulator thickness. Thus, in many embodiments, improved electrical properties may be obtained without incurring the potential gate insulator defects or increased leakage current by the use of gate insulators having a larger dielectric constant than found in silicon dioxide.

A gate dielectric in a transistor may have both a physical gate dielectric thickness and an equivalent oxide thickness (EOT or $t_{eq}$). The EOT quantifies the electrical properties, such as capacitance, of the high k gate dielectric in terms of a representative physical thickness of a silicon dioxide gate dielectric. The term $t_{eq}$ may be defined as the thickness of a theoretical $SiO_2$ layer that may have the same capacitance density as a given dielectric. For the purposes of this document, a "high-k" gate dielectric is one that has a dielectric thickness greater than that of silicon dioxide.

A $SiO_2$ layer deposited on a Si surface as a gate dielectric may have a $t_{eq}$ larger than its physical thickness, t. This $t_{eq}$ results from the capacitance in the surface channel upon which the SiO$_2$ is deposited due to the formation of a depletion/inversion region. The depletion/inversion region may result in the t$_{eq}$ being from 3 to 6 Angstroms (Å) larger than the physical SiO$_2$ thickness, t. With the semiconductor industry moving to scale the gate dielectric equivalent oxide thickness downward to less than 10 Å, the physical thickness for a SiO$_2$ layer used for a gate dielectric may be approximately 4 to 7 Å.

Additional features for a SiO$_2$ gate dielectric layer may depend upon the properties of the gate electrode used in conjunction with the SiO$_2$ gate dielectric. Using a conventional polysilicon gate may result in an additional increase in t$_{eq}$ for the SiO$_2$ layer. The additional t$_{eq}$ value may be reduced by using a metal gate electrode, though metal gates are not always used in complementary metal-oxide-semiconductor (CMOS) field effect transistor technology or in nonvolatile memory devices such as flash memory or NROM. Thus, future devices may be constructed with a physical SiO$_2$ gate dielectric layer of about 5 Å or less. Such a thin SiO$_2$ oxide layer may create undesirable current leakage across the thin oxide.

SiO$_2$ may be commonly used as a gate dielectric, in part, due to its electrical isolation properties in a SiO$_2$—Si based structure. This electrical isolation may be due to the relatively large band-gap of SiO$_2$ (8.9 eV) resulting in a relatively good electrical insulator. Significant reductions in band-gap value below those provided by SiO$_2$ may reduce the utility of a material for use as a gate dielectric. However, as the thickness of a SiO$_2$ layer decreases, the number of atomic layers, or monolayers, of the material in the insulator layer decreases. At some thickness, the number of monolayers may be so small that the SiO$_2$ layer may not have as complete an arrangement of atoms as found in a thicker, or bulk, layer. As a result of incomplete formation relative to a bulk structure, a thin SiO$_2$ layer of only one or two monolayers may fail to form a full band-gap. The lack of a full band-gap in a SiO$_2$ gate dielectric may cause an effective short between an underlying conductive silicon channel and an overlying conductive gate. This undesirable property tends to limit the minimum physical thickness to which a SiO$_2$ layer may be scaled, perhaps to about 7-8 Å. Therefore, for future devices to have a t$_{eq}$ less than about 10 Å, dielectrics other than SiO$_2$ may be more useful as a gate dielectric.

For a gate dielectric layer, the capacitance may be approximately determined using a parallel plate capacitance formula: C=k∈$_0$A/t, where k is the dielectric constant, ∈$_0$ is the permittivity of free space, A is the area of the capacitor, and t is the thickness of the dielectric. The thickness t of a material may be related to its t$_{eq}$ for a given capacitance, with SiO$_2$ having a dielectric constant k$_{ox}$=3.9, as $$t=(k/k_{ox})t_{eq}=(k/3.9)t_{eq}.$$

Thus, materials with a dielectric constant greater than that of SiO$_2$ (typically about 3.9) may have a physical thickness considerably larger than a desired t$_{eq}$, while providing the desired equivalent oxide thickness. For example, an illustrative high-k dielectric material with a dielectric constant of 10, such as aluminum oxide Al$_2$O$_3$, may have a thickness of 25.6 Å to provide a t$_{eq}$ of 10 Å. Thus, in some embodiments, a reduced equivalent oxide thickness for transistors may be realized by using dielectric materials with higher dielectric constants than SiO$_2$.

As noted above, an equivalent oxide thickness for lower transistor operating voltages and smaller transistor dimensions may be realized by using materials having a higher dielectric constant. However, additional fabrication issues can make determining a suitable replacement for SiO$_2$ difficult. If the use of silicon-based devices continues, then potentially significant constraints on the substitute dielectric material may occur. For example, during the formation of the dielectric on the silicon layer, there exists the possibility that a small layer of SiO$_2$ may be formed in addition to the desired dielectric. The electrical result may comprise a dielectric layer having two sub-layers connected to each other and to the silicon layer on which the dielectric is formed. In such a case, the resulting capacitance would be that of two dielectrics in series and the t$_{eq}$ of the dielectric layer may be considered as the sum of the SiO$_2$ thickness and a multiplicative factor of the thickness t of the dielectric being formed:

$$t_{eq}=t_{SiO_2}+(k_{ox}/k)t.$$

If a SiO$_2$ layer is formed in the process of forming the high k dielectric, the t$_{eq}$ may again be limited by the SiO$_2$ layer. Thus, a useful property of a high k dielectric may be an oxygen barrier to prevent a layer of SiO$_2$ from forming on the silicon surface. The layer directly in contact with the silicon layer may provide a high quality interface for high channel carrier mobility and low surface charge density.

One of the advantages of using SiO$_2$ as a gate dielectric may be that the formation of the SiO$_2$ layer results in an amorphous gate dielectric. An amorphous structure for a gate dielectric may reduce leakage current problems associated with grain boundaries in polycrystalline gate dielectrics, sometimes implicated in high current leakage paths. Crystal grain size and orientation changes throughout a polycrystalline gate dielectric may cause variations in the film's dielectric constant, along with uniformity and surface topography issues. Materials having a high dielectric constant relative to SiO$_2$ may also have the disadvantages of a crystalline form, with a lower band gap width.

Another consideration for selecting the material and method for forming a dielectric film for use in electronic devices may be the roughness of the dielectric film on a substrate. For example, surface roughness may have a significant effect on the electrical properties of the gate oxide and the resulting operating characteristics of the transistor. The leakage current through a physical 1.0 nm gate dielectric may increase by a factor of 10 for every 0.1 increase in the root-mean-square (RMS) roughness of the dielectric layer. Surface roughness may be increased during a sputtering deposition process, when particles of the material to be deposited may bombard the surface at a high energy. When a sputtered particle hits the surface, some particles may adhere and other particles may cause surface damage by knocking out a portion of the surface layer creating pits. The surface of such a deposited dielectric layer may have a rough contour due to the rough interface at the body region and thus the electrical properties of a thin film may not be as good as the values in a bulk sample of the same material. Thus the method used to form a thin film dielectric may have a substantial impact on the usefulness of the material in electronic devices.

In a nonvolatile memory device such as an NROM, the use of a silicon nitride layer between two silicon dioxide layers may result in a gate dielectric that has a higher overall dielectric constant than the silicon dioxide insulator layers used in floating gate memory devices and thus provide an effectively thinner gate dielectric and improved transistor properties. The thickness of the nitride layer may be made smaller and more uniform by forming the nitride film by a nitridation reaction with the underlying oxide film. For example, a tunneling oxide film formed of SiO$_2$ may have the surface converted to a silicon nitride (Si$_3$N$_4$) by a high temperature operation, by laser heating, or by a plasma heating in an ammonia (NH$_3$) ambient or other source of nitrogen, such as nitrogen gas or nitrous oxide ($N_2O$). The resulting thin nitride film may provide improved transistor threshold voltage distributions since the potential variations in the distance of the trapped charges from the channel region are reduced by the reduced thickness of the nitride layer. However, the thin nitride layer may also present problems due to the number of injected charge carriers (for example electrons) that are trapped in the nitride rather than continuing to tunnel through the nitride and the blocking insulator. These non-trapped charges may result in increased programming times.

A method to reduce the number of non-trapped charges in either a thin nitride layer grown by converting an oxide layer or in a deposited nitride layer may be to engineer the band-gap of the tunnel insulator formed between the nitride layer and the substrate, as compared to the band-gap of the blocking insulator formed between the nitride layer and the transistor gate electrode. By increasing the band-gap of the blocking insulator to about the 8.9 eV found in silicon dioxide layers, or by reducing the band-gap of the tunnel insulator to below 8.9 eV, or both, a blocking barrier may be formed that reduces the number of charges that successfully tunnel from the substrate to the gate electrode.

In an illustrative embodiment, a non-volatile memory device, such as an NROM, may have a thin nitrided surface of a tunneling insulator formed of metal oxide or a metal oxycarbide (i.e., having a general formula of $M_XO_Y$, or $M_XC_YO_Z$) which may provide a charge carrier trap that has essentially all the trapped charges at the same distance from the transistor channel region, resulting in tight threshold distribution. The thin nitride trap layer may have a large portion of the tunneling electrons or the hot injected electrons from the tunneling layer tunnel right through the trap layer due to the thin layer, as tunneling depends exponentially on the barrier height and thickness. This activity may be improved by the formation of a charge blocking insulator over the nitrided surface which may have a larger band gap value than the tunneling insulator, resulting in reflection of charges tunneling through the nitride trapping layer and improving the charge trapping efficiency of the thin nitrided layer. The dielectric structure may be formed with a high k material for the tunneling layer and may thus obtain faster transistor operation, the charge reflecting layer may obtain faster programming and erase times, due to the efficiency of the charge trapping layer. These NROM devices may be used in integrated circuits as persistent memory devices. The dielectric structure may be formed by nitridation of a surface of a tunnel insulator using ammonia or other source of nitrogen and an energy source of a thermal process, a plasma process, a laser process, or a radiation process. The nitride trapping layer may also be formed by chemical vapor deposition, atomic layer deposition, or by physical vapor deposition.

It should be noted that the above mentioned illustrative embodiments are not intended to be limited to the disclosed arrangement and methods, but may include any method of forming a relatively thin (from one to about five molecular layers) charge trapping layer on a tunnel insulator material having a lower band gap value than an overlaying charge blocking insulator. The structure may be formed of any combination of metals or semiconductors in oxide, nitride, or carbide forms, or combinations thereof.

FIG. 1 illustrates an electronic device according to various disclosed embodiments. The electronic device 100, which may comprise a transistor, a non volatile transistor, a memory element, a tunnel diode, or other basic electronic devices and more complex electronic devices formed from groups of basic electronic devices, may be formed on a semiconductor substrate 102 having a selected charge carrier polarity doping type, such as P type for predominant hole carriers, or N type for predominant electron carriers. The substrate 102 may have a channel region 104 that is under the control of a gating signal and source and drain regions 106 that have a doping type opposite of the substrate 102 doping type. The transistor may comprise an NROM nonvolatile memory transistor and may include a tunnel insulator 108 on the channel region 104 extending at least between the source and drain regions 106. The tunnel insulator may be formed of $SiO_2$, other silicon oxides or other insulator materials such as metal oxides, metal carbides, and metal oxycarbides. The silicon dioxide may have a band-gap of about 8.9 eV.

The tunnel insulator 108 may have a charge trapping layer 110 formed by deposition or by surface conversion of the tunnel insulator material. The trapping layer may be formed of silicon nitride. The trapping layer may be formed by a chemical nitridation reaction of ammonia or other nitrogen source, of the surface of the tunnel insulator material 108, using thermal processing, laser processing, plasma processing, or radiation processing to drive the chemical reaction. The nitride trapping layer is thinned to localize the trapped charge at a fixed distance from the channel region 104, providing uniform threshold voltage for the device 100. For example, the nitride trapping layer may be one or two molecular layers and be less than 1 nm in thickness.

The trapping layer 110 may have a blocking insulator 112 formed on a top surface opposite the tunnel insulator 108. The blocking insulator may be formed of silicon oxide, silicon oxynitride, or other insulator materials. The blocking insulator material 112 may have a band gap value larger than a band gap of the tunnel insulator 108, to provide a charge reflector interface to improve the trapping efficiency of the nitride trapping layer 110. Improved trapping efficiency may result in device programming time reduction.

The gate electrode 114 may be formed on the blocking insulator 112, or on the trapping layer 110 if the blocking insulator is not present, and may be formed of doped polycrystalline silicon or other conductive material. The gate electrode may electrically interconnect the device 100 to adjacent devices or to another conductive material.

The NROM transistor illustrated in FIG. 1 may operate by either or both hot electron injection and Fowler-Nordheim tunneling of electrons, which may occur at or near grounded source and/or drain regions 106 during the operation of the transistor 100, such as during operation in the saturated mode near the point in the channel region 104 where an inversion region ends. The charges may pass through the tunnel insulator 108 and become trapped in the trapping layer 110, thus shifting the threshold voltage of the device 100. This may be known as programming, or writing data to, the device 100.

Figure 2:
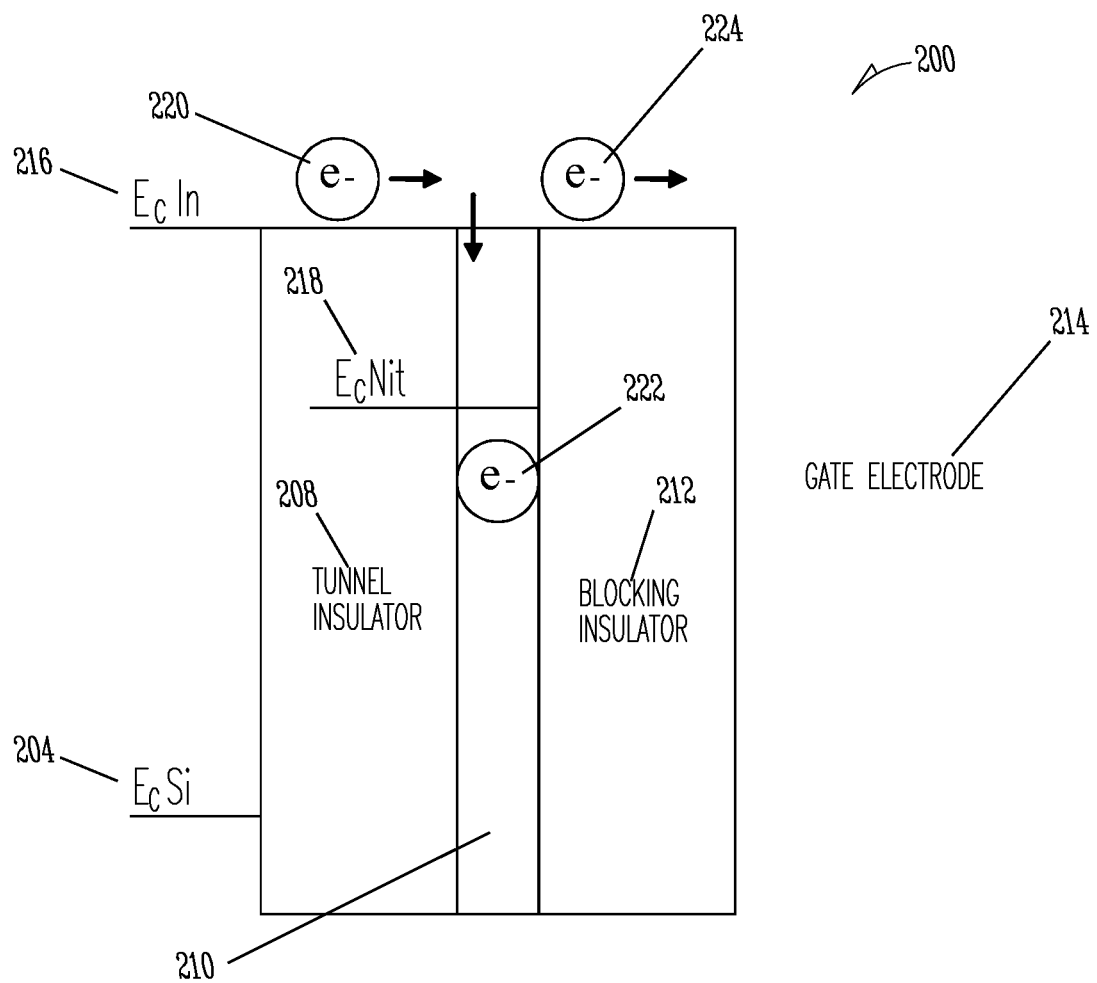
FIG. 2 illustrates a band diagram of a tunnel insulator and blocking insulator according to various embodiments of the invention.

FIG. 2 illustrates a band diagram of a tunnel insulator and blocking insulator according to various embodiments. The band diagram may be compared to the device of FIG. 1 and similar portions of the figures have the same last two numbers in their designations. The device 200 may have a channel region (see channel region 104 of FIG. 1) with a conduction band value 204. A tunnel insulator 208 formed on the channel region may have a conduction band value, which may be higher than the conduction band of a semiconductor. A trap layer 210, which may be formed of a nitride layer, may have a conduction band value of 218. A blocking insulator 212 may have a conduction band value that is the same as or different from the conduction band value of the tunnel insulator 208. In an embodiment where the blocking insulator is formed of the same material as the tunnel insulator, the band diagram may be as presented in FIG. 2. An electron or other charge carrier 220, which may be tunneling through the tunnel insulator 208 or may be from hot electron injection, may travel through or over the barrier represented by the tunnel insulator. The charge carrier 220 is shown in FIG. 2 as having enough energy to be above the conduction band 216 for insulator 208, but many embodiments are not so limited.

The charge carrier 220 maybe trapped in layer 210 in trap state 222, or may pass through the blocking insulator 212, as shown at location 224, so as to enter the gate electrode 214. Charges that tunnel completely through the dielectric layers 208, 210 and 212 to the gate electrode 214 can result in a loss of trapping efficiency of the trap layer 210, reducing the signal voltage at the gate electrode and increasing the write time or programming time of the device 200.

Figure 3:
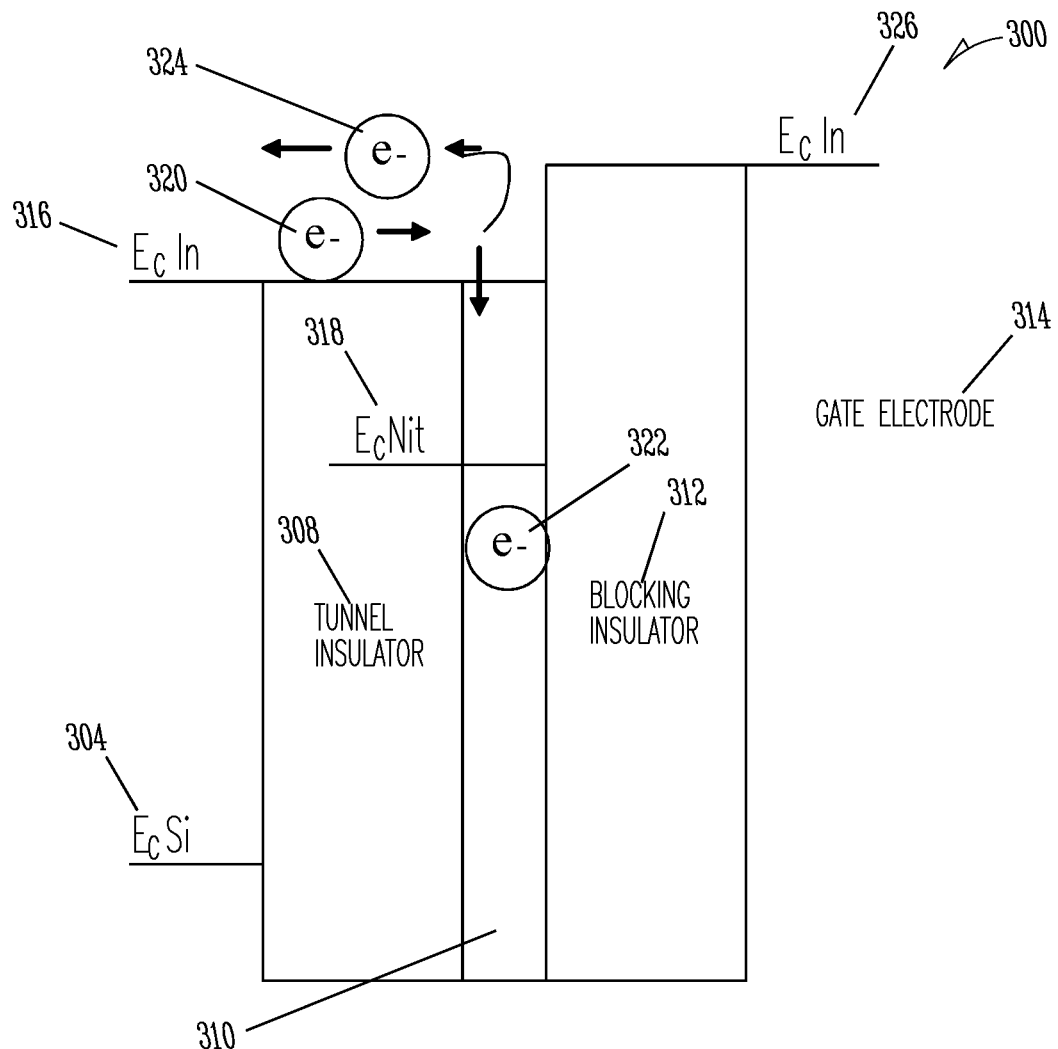
FIG. 3 illustrates another band diagram of a tunnel insulator and blocking insulator according to various embodiments of the invention.

FIG. 3 illustrates another band diagram of a tunnel insulator and blocking insulator according to various embodiments. In this case, a charge carrier 320 may pass through or over the barrier represented by the tunnel insulator 308, and may be trapped in the trap layer 310, as shown for charge 322, which is below the conduction band level 318 for the trapping material. The blocking insulator 312 is shown as having a conduction band value 326 that is higher than the conduction band value 316 for the tunnel insulator 308. As a result of the tunnel insulator 308 having a lower conduction band value than the blocking insulator 312, a charge 320 may be less likely to tunnel through the blocking insulator, perhaps being reflected as shown in charge 324. Thus, the reflected charge 324 has at least one more chance to be trapped in layer 310 and become a trapped charge 322.

Figure 4:
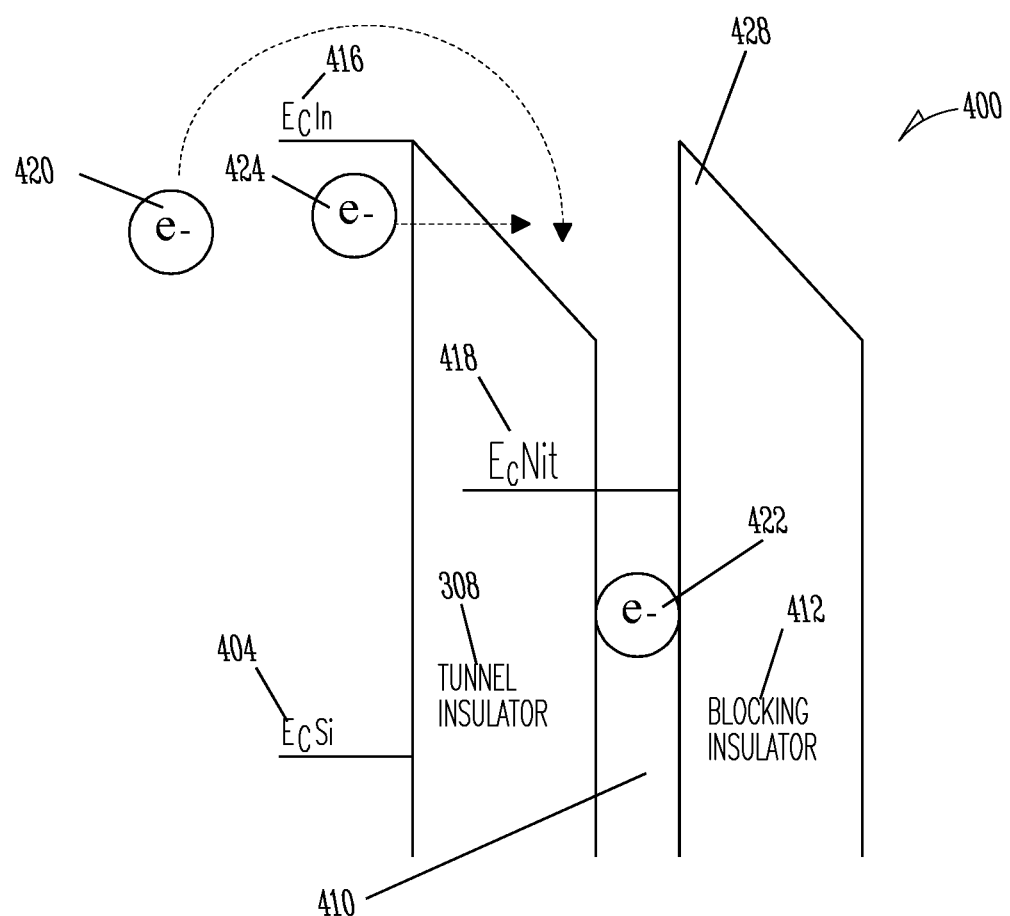
FIG. 4 illustrates a writing operation band diagram according to various embodiments of the invention.

FIG. 4 illustrates a writing operation band diagram according to various embodiments. The band diagram for a trap dielectric structure with a negative relative charge on the substrate having conduction band value 404 is shown with a hot electron injection charge 420 having enough energy to go over the barrier represented by the tunnel insulator 408. The charge 424 is shown with an increased probability of penetrating the barrier 408 because, while the barrier height is still the same, the barrier thickness at the energy of charge 424 is now thinned and the probability of tunneling is exponentially dependent upon the height and upon the width of the barrier.

Figure 5:
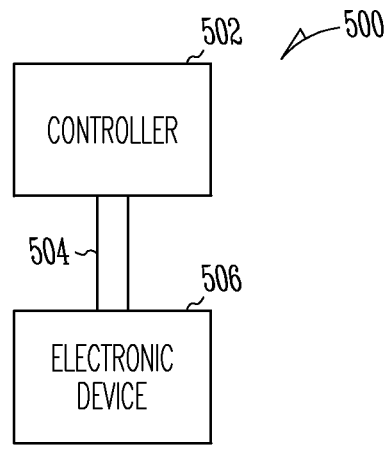
FIG. 5 illustrates a simplified block diagram of a controller coupled to an electronic device, according to various embodiments of the invention.

FIG. 5 illustrates a simplified diagram for an illustrative electronic system 500 having one or more devices including a dielectric layer containing a charge trapping region according to various disclosed embodiments. The electronic system 500 may include a controller 502, a bus 504, and an electronic device 506, where bus 504 provides electrical conductivity between controller 502 and electronic device 506. In various embodiments, the controller 502 and/or electronic device 506 may include a nonvolatile memory device as previously discussed herein. Electronic system 500 may include information handling, wireless, telecommunication, fiber optic, automotive, electro-optic, mobile electronics, handheld devices, and computer systems. Electronic device 506 may comprise a microprocessor, a floating point unit, an arithmetic logic unit, a memory device, a multiplexer, an address decoder, a power controller, or any other electronic device used in computer, telecommunication, sensor, display and other products.

Figure 6:
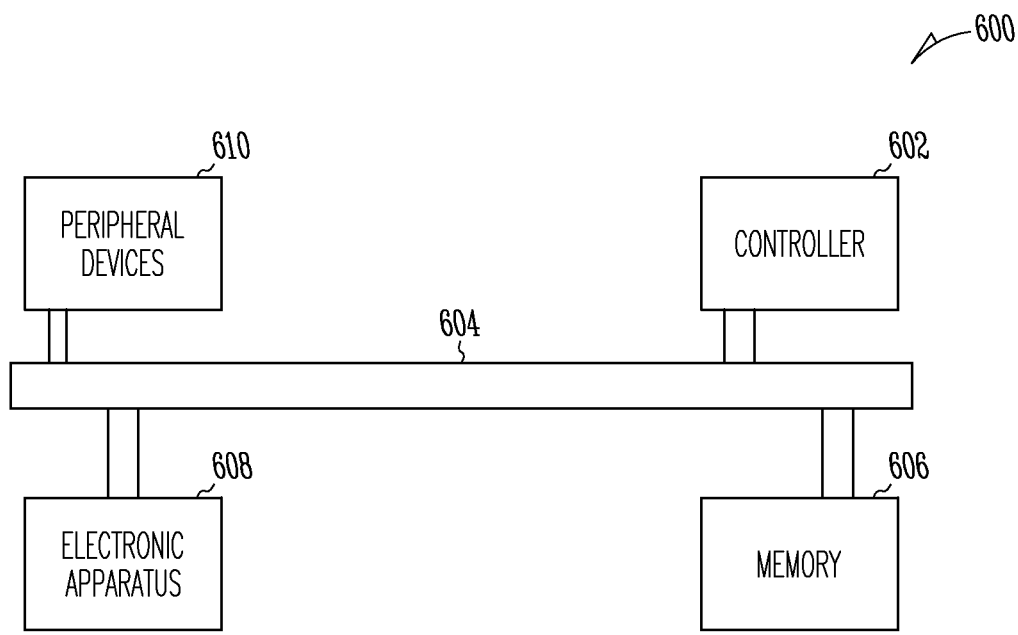
FIG. 6 illustrates an electronic system having devices formed in accordance with various embodiments of the invention.

FIG. 6 depicts a diagram of an electronic system 600 having at least one device formed in accordance with the disclosed embodiments, including a controller 602 and a memory 606. Controller 602 and/or memory 606 may include a memory device as a portion of a memory. The system 600 may also include an electronic apparatus 608 and a bus 604, where the bus 604 may provide electrical conductivity and data transmission between controller 602 and electronic apparatus 608, and between controller 602 and memory 606. The bus 604 may include an address, a data bus, and a control bus, each independently configured. The bus 604 may use common conductive lines for providing address, data, and/or control, the use of which may be regulated by the controller 602. In some embodiments, the electronic apparatus 608 may include additional memory devices configured similar to the memory 606. Some embodiments may include an additional peripheral device 610 coupled to the bus 604. In an embodiment, the controller 602 comprises a processor. Any of the controller 602, the memory 606, the bus 604, the electronic apparatus 608, and peripheral devices 610 may include a memory device (e.g., similar to the device 506 of FIG. 5) in accordance with the disclosed embodiments.

System 600 may include, but is not limited to, information handling devices, telecommunication systems, mobile electronic devices such as laptop computers, handheld personal electronic devices such as personal digital assistants (PDA), handheld communication devices such as cell phones, and computers. Peripheral devices 610 may include displays, additional storage memory, or other control devices that may operate in conjunction with controller 602 and/or memory 606.

It should be understood that some embodiments are equally applicable to any size and type of memory circuit and are not intended to be limited to a particular type of memory device. Thus, the described transistor arrangement may be used in NROM type device, but may be found as a portion of other memory devices, such as a DRAM (Dynamic Random Access Memory), SRAM (Static Random Access Memory) or flash memory. Additionally, the DRAM may comprise a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies. Many embodiments may be realized as methods. For example, some embodiments include a method of forming a charge trapping dielectric on a substrate, where the dielectric structure has a first portion on the surface of the substrate having a first band gap value, a second portion disposed upon the first portion to trap charge carriers, and a third portion with a second band gap value that is higher than the first band gap value. The first portion of the dielectric may comprise a tunneling insulator formed of a material having a band gap lower than the 8.9 eV of silicon dioxide and thin enough to allow electron tunneling and hot electron injection. The first material may be formed of semiconductor oxides, semiconductor carbides, metal oxides, metal carbides, mixed metal oxides and carbides, oxynitrides of metal or semiconductors, oxycarbides of metals or semiconductors, and mixtures of various metal and semiconductor base materials with mixtures of oxygen, carbon, and nitrogen to provide an engineered band gap value for the tunnel insulator. Some embodiments include silicon oxycarbide, $Si_XC_YO_Z$, where the subscript values are selected to provide a first band gap value of about 4 eV. However, the band gap may be selected to vary from about 1 eV to about 9 eV. The tunnel insulator band gap may be selected to provide a combination of high dielectric constant (high k) for fast transistor operation and a low enough band gap as compared to the blocking insulator band gap value to improve the charge trapping efficiency of the second portion of the dielectric structure. Embodiments include zirconium, hafnium and titanium oxides, for example having a formula of $Ti_XO_Y$ for titanium oxide, and having band gaps from about 5 to 6 eV may also be developed.

The second portion of the dielectric structure may include a nitrided portion of the tunnel insulator material to form a thin charge trapping layer, which has almost all of the trapped charge at the same distance from the channel region under the tunnel insulator, and thus has a tight distribution of threshold voltages. The thin nitride charge trapping layer may comprise a single molecular layer less than 1 nm in thickness. The second portion may be formed by a variety of processes, including nitridation reactions using nitrogen, ammonia, or nitrous oxide in a thermal process, a laser heating process, a radiation heating process, or a plasma process. Some embodiments include forming the thin nitride second portion by atomic layer deposition, chemical vapor deposition, or physical vapor deposition processes.

The third portion of the dielectric structure may comprise a blocking insulator layer having a higher band gap than the tunnel insulator and thus may reflect tunneling electrons and hot injection electrons back towards the charge trapping nitride layer. The third portion may be formed of silicon oxide, $SiO_2$, silicon germanium carbide or silicon germanium oxynitride. The thickness of the third portion may be selected to determine the overall threshold voltage of the transistor containing the dielectric structure. Such a transistor may comprise a nonvolatile memory transistor such as a NROM device.

Some embodiments may include an electronic device having a semiconductive substrate, which may have a selected crystal orientation such as [100], [111], [110] or other well known surface orientations, a first insulator material on a part of the substrate having a first band gap value, a second insulator material on the first insulator material having a charge trapping interface with the first insulator material, a third insulator material having a second band gap value, and a conductor on the third insulator material. The second band gap value may be selected so as to be higher than the first band gap value to provide a reflection surface for tunneling charges and improve the trapping efficiency of the charge trapping interface. The second insulator material may comprise a nitride layer, such as a metal nitride layer, and it may form a portion of the first insulator material with added nitrogen from a thermal nitridation reaction of the first insulator material prior to deposition of the third insulator. Some embodiments may include transistors, electronic devices, memory devices, electronic systems, and personal electronic systems having nonvolatile memory transistors constructed according to the various embodiments contained herein.

The detailed description refers to the accompanying drawings that show, by way of illustration, specific aspects and embodiments in which the present disclosed embodiments may be practiced. These embodiments are described in sufficient detail to enable those skilled in the art to practice aspects of the present invention. Other embodiments may be utilized, and structural, logical, and electrical changes may be made without departing from the scope of the disclosed embodiments. The various embodiments are not necessarily mutually exclusive, as some embodiments can be combined with one or more other embodiments to form new embodiments.

The terms "wafer" and "substrate" as used in the description may include any structure having an exposed surface with which to form an integrated circuit (IC) structure. The term "substrate" is understood to include semiconductor wafers. The term "substrate" is also used to refer to semiconductor structures during processing and may include other layers that have been fabricated thereupon. Both "wafer" and "substrate" may include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over", and "under" are defined with respect to the conventional plane or surface being on the top surface of the wafer or substrate, regardless of the orientation of the wafer or substrate.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The detailed description is, therefore, not to be taken in a limiting sense and the scope of the present invention is defined only by the appended claims, along with the full scope of equivalents to which such claims are entitled.

What is claimed is:

1. A system comprising:
a controller; and
an electronic apparatus coupled to the controller, wherein the electronic apparatus includes:
an amorphous dielectric structure in an integrated circuit, the amorphous dielectric structure containing a tunneling dielectric material consisting of $M_XC_YO_Z$ wherein $M_X$ is a metal, a metal oxide charge blocking dielectric material, and a nitride charge trapping dielectric material between the tunneling dielectric material and the metal oxide charge blocking dielectric material wherein the nitride charge trapping dielectric material consists of a nitrided surface of the tunneling dielectric material and an overall threshold voltage of the electronic apparatus is set by an equivalent oxide thickness of the metal oxide charge blocking dielectric material; and
a conductive layer contacting the amorphous dielectric structure.

2. The system of claim 1, wherein the electronic apparatus includes a memory.

3. The system of claim 1, wherein the tunneling dielectric material includes an oxycarbide material.

4. The system of claim 1, wherein the tunneling dielectric material has a lower conduction band value than the metal oxide charge blocking dielectric material.

5. The system of claim 1, wherein the nitride charge trapping dielectric material comprises a nitrided monolayer of the tunneling dielectric material and has a thickness of less than 1 nm.

6. The system of claim 1, wherein the amorphous dielectric structure is disposed above a substrate structure.

7. The system of claim 6, wherein the substrate structure comprises a channel region that is under control of a gating signal and source and drain regions that have a doping type opposite of a substrate doping type.

8. The system of claim 1, wherein the electronic apparatus comprises an NROM nonvolatile memory transistor.

9. The system of claim 1, wherein the nitride charge trapping dielectric material is configured to localize trapped charge at a fixed distance from a channel region.

10. A system comprising:
a controller; and
a non-volatile memory device coupled to the controller, wherein the memory device includes a dielectric structure comprising:
  a first structure disposed above the surface of a substrate such that the first structure is an amorphous dielectric material disposed on and contacting a device region operable to conduct current in the memory device, the first structure having a composition with a first band-gap value, the composition consisting of $M_XC_YO_Z$ wherein $M_X$ is a metal;
  a second structure disposed on and contacting the first structure by nitridation of a surface of the composition of the first structure, the second structure consisting of a dielectric nitride of the composition and configured to be a charge trapping region having a composition to trap charge carriers, the composition of the second structure having a band-gap value less than the first band-gap value; and
  a third structure disposed on and contacting the second structure, the third structure having a second band-gap value, the second band-gap value being greater than the first band-gap value, the third structure being a dielectric; and
  a conductive material disposed on and contacting the third structure, the conductive material conductively coupled to a structure on the substrate separate from the dielectric structure.

11. The system of claim 10, wherein the first structure has a dielectric constant greater than 10 and the third structure has a dielectric constant of 4.

12. The system of claim 10, wherein the substrate comprises a silicon crystal having a crystal orientation at the surface and the dielectric structure comprises an equivalent oxide value for a first dielectric constant of the first structure, plus an equivalent oxide value for a second dielectric constant of the second structure, plus an equivalent oxide value for a third dielectric constant of the third structure.

13. The system of claim 10, wherein the dielectric structure comprises a total equivalent oxide thickness of less than 1.0 nm.

14. The system of claim 10, wherein the third structure comprises one of: silicon oxide, silicon dioxide, silicon germanium carbide, or silicon germanium oxynitride.

15. The system of claim 10, wherein the first structure comprises a first thickness that is greater than a second thickness of the second structure and the third structure comprises a third thickness is greater than the second thickness.

\* \* \* \* \*